United States Patent [19]
Belouet et al.

[11] Patent Number: 5,780,120
[45] Date of Patent: Jul. 14, 1998

[54] METHOD FOR PREPARING LASER FACES

[75] Inventors: Christian Belouet, Sceaux; Dominique Boccon-Gibod, Paris; Sylvaine Kerboeuf, Fresnes, all of France

[73] Assignee: Alcatel Alsthom Compagnie Generale d'Electricite, Paris Cedex, France

[21] Appl. No.: 769,137

[22] Filed: Dec. 18, 1996

[30] Foreign Application Priority Data

Dec. 22, 1995 [FR] France ................. 95 15397

[51] Int. Cl.$^6$ ................................ B05D 3/00
[52] U.S. Cl. .............. 427/554; 427/255.2; 427/294; 427/309; 427/586; 427/596
[58] Field of Search ............... 427/554, 596, 427/255.2, 294, 309, 586

[56] References Cited

U.S. PATENT DOCUMENTS 4,987,007  1/1991  Wagal et al. ................ 427/53.1

FOREIGN PATENT DOCUMENTS

0416190A1  3/1991  European Pat. Off. .
4340752A1  6/1994  Germany .

OTHER PUBLICATIONS

G. Lim et al, "Novel Technique for Fabricating non absorbing mirror laser", *Proceedings of the International Semiconductor Laser Conference*, Maui, Hawaii, Sep. 19–23, 1994, No. Conf. 14, 19 Sep. 1994, Institute of Electricaland Electronics Engineers, pp. 155/166.

"Improved operating lifetime of lasers with dry-etched mirrors", *IBM Technical Disclosure Bulletin*, vol. 33, No. 6A, 1 Nov. 1990, p. 285.

Patent Abstracts of Japan, vol. 008, No. 209 (E–268), 22 Sep. 1984 corresponding to JP-A-59 094892 dated May 31, 1984.

Patent Abstracts of Japan, vol. 018, No. 128 (C01174), 2 Mar. 1994 corresponding to JP-A-05 311429 dated Nov. 22, 1993.

*Primary Examiner*—Bernard Pianalto
*Attorney, Agent, or Firm*—Sughrue, Mion, Zinn, Macpeak & Seas, PLLC

[57] ABSTRACT

A method of preparing faces of a laser based on III-IV compounds, the method comprising the following operations:

1) the faces of the laser are opened;
2) said faces of the laser are placed in an enclosure in which there obtains a pressure of about $10^{-7}$ mbar to about $10^{-8}$ mbar, and they are subjected to a step of cleaning by irradiation with a pulsed laser; and
3) the same pulsed laser is used to ablate a target so as to subject said faces to a passivation operation whereby silicon Si or gallium nitride GaN is deposited thereon by the pulsed laser deposition method until a thickness is obtained lying in the range 2 Å to 20 Å.

12 Claims, 1 Drawing Sheet

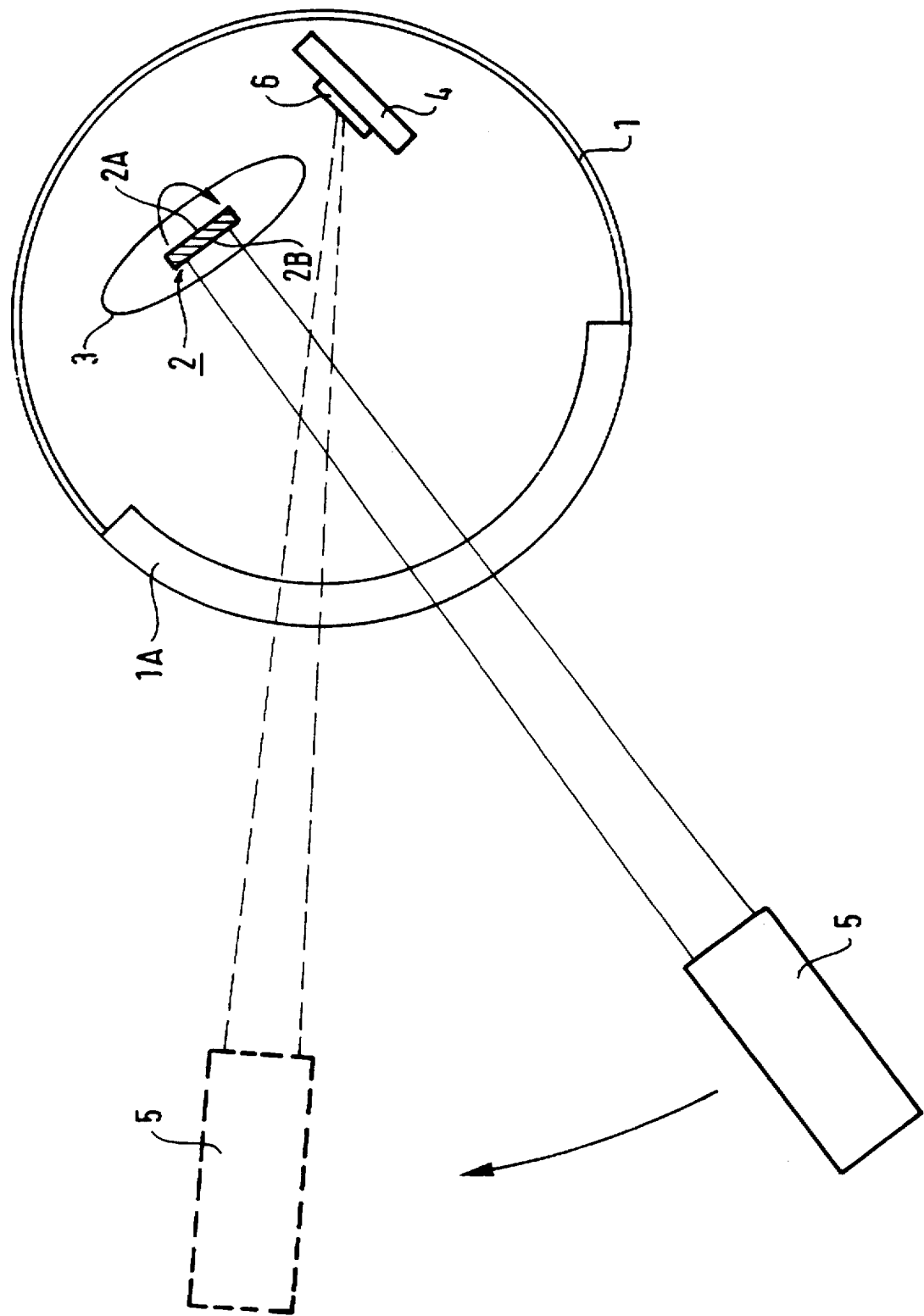

METHOD FOR PREPARING LASER FACES

The present invention relates to preparing the faces of lasers based on III–IV compounds, and in particular GaAs/GaAlAs pump lasers operating at 0.98 μm. This is the example described below by way of non-limiting indication.

BACKGROUND OF THE INVENTION

An important limit on the lifetime of GaAs/GaAlAs lasers is due to sudden and irreversible deterioration of the faces. The origin of this phenomenon is attributed to a process involving a cascade of events and in particular carrier recombination in fault-containing zones of the faces, a reduction in the width of the forbidden band in said zones due to the heating caused by the carrier recombination, and finally increasing optical absorption of the radiation emitted by the laser due to the reduction in bandwidth. These phenomena contribute to accelerated heating of the faces of the laser and lead finally to irreversible destruction of the faces of the laser, which is known as "catastrophic optical damage" (COD).

This destruction has been observed and studied in detail, in particular in the document "Degradation behavior of 0.98 μm strained quantum well in GaAs/AlGaAs lasers under high power operation" by Mitsuo Fukuda, Masanobu Okayasu, Jiro Temmyo and Jun-ichi-Nakano, IEEE, Journal of Quantum Electronics, Vol. 30, No. 2, February 1994, pp. 471–476.

One of the problems posed is thus to minimize carrier recombination on the faces of the laser. This recombination is stimulated by the presence of oxides which form during or after the technological steps associated with the making of the faces.

To minimize oxidation, proposals have been made, in particular in document EP-A-0 416 190, to make the faces of the laser by cleavage in an ultra-vacuum (about $10^{-12}$ mbar) and to proceed with depositing a passivation layer.

Implementing that technique requires major investment giving rise to high manufacturing cost.

OBJECTS AND SUMMARY OF THE INVENTION

A first object of the present invention is to provide a method of preparing faces which is cheap.

Proposals have been made to make the passivation layer by thermally evaporating silicon. That evaporation technique has the drawback of taking a very long time, e.g. about 1 hour, to obtain a passivation layer that is about 5 angstroms (Å) to 10 Å thick. Also, in that technique the silicon atoms arrive with low energy and they attach poorly. Finally, in that technique, it is necessary to perform the operation with an oxygen partial pressure that is very low in order to avoid depositing oxygen simultaneously with the silicon. It has been calculated that if it were desired to obtain a deposit having only one atom of oxygen per 1,000 atoms of silicon, it would be necessary to lower the partial pressure of oxygen to below $10^{-12}$ mbar, which is prohibitive and returns to the difficulties mentioned above.

A second object of the invention is to provide a passivation method that enables passivation material to be deposited quickly enough for the oxygen content to be small enough without requiring too small an oxygen partial pressure to be obtained.

The article "Novel technique for fabricating non-absorbing mirror laser" by Gabgyu Lim, Jaeho Lee, Gue-orugi Park, and Taeil Tim, published in XIV IEEE Semiconductor Laser Conference, Sep. 10–23, 1994, describes the use of an excimer laser for treating the faces of a laser that have just been cleaved by annealing. That document that does not mention the face treatment energies.

A third object of the present invention is to define operating conditions making it possible to obtain best results.

The invention provides a method of preparing faces of a laser based on III–IV compounds, the method comprising the following operations:

1) the faces of the laser are opened;
2) said faces of the laser are placed in an enclosure in which there obtains a pressure of about $10^{-7}$ mbar to about $10^{-8}$ mbar, and they are subjected to a step of cleaning by irradiation with a pulsed laser; and
3) the same pulsed laser is used to ablate a target so as to subject said faces to a passivation operation whereby silicon Si or gallium nitride GaN is deposited thereon by the pulsed laser deposition method until a thickness is obtained lying in the range 2 Å to 20 Å.

Advantageously, operation 2) is performed in the same enclosure as operation 1).

When the deposit is of gallium arsenide, said deposition is performed by pulsed laser ablation of a liquid gallium target in a nitrogen atmosphere with an ECR plasma being created.

According to another characteristic of the invention, said faces are subjected to additional deposition of a film that is transparent at the wavelength of the laser to be treated and that is proof against oxygen, such as DLC carbon, silicon carbide SiC, or silicon nitride $Si_3N_4$, made using the same pulsed laser operating at a fluence of 1 J/cm$^2$ to 5 J/cm$^2$ until a thickness of several tens of A have been obtained.

Advantageously, said additional deposition is performed in the same enclosure as the cleaning operation.

In a particular implementation of the method, the pulsed laser is an excimer laser operating with pulses of duration lying in the range 10 ns to 30 ns at a rate lying in the range 10 Hz to 100 Hz.

In a variant, the pulsed laser is a neodymium-doped YAG laser operating with pulses of duration lying in the range 4 ns to 6 ns at a rate lying in the range 10 Hz to 100 Hz.

When the treated laser is a GaAs/GaAsAl laser for pumping at 0.98 μm, the laser fluence during the cleaning operation lies in the range 70 mJ/cm$^2$ to 120 mJ/cm$^2$.

The laser fluence during the passivation operation lies in the range 1 J/cm$^2$ to 5 J/cm$^2$.

According to another characteristic of the invention, prior to the passivation stage, an additional cleaning stage is performed under an atmosphere of chlorine or of bromine, using a pulsed excimer laser.

When the atmosphere is a chlorine atmosphere, the pressure is about $10^{-5}$ mbar.

The fluence of the laser is then about 80 mJ/cm$^2$.

The invention also provides apparatus for implementing the above method, the apparatus comprising:

an enclosure in which a pressure lying in the range $10^{-7}$ mbar to $10^{-8}$ mbar is maintained and containing, in particular, a support for a laser rod in which laser faces have been cut and are to be treated, means for enabling the support to pivot, at least one support for a target for treatment by the laser ablation technique, with said enclosure further including at least one optical window for passing a laser beam; and outside said enclosure, a laser provided with means for adjusting its fluence, its firing rate, and the direction of its beam to strike the faces of the laser to be treated or the target.

BRIEF DESCRIPTION OF THE DRAWING

The method is described with reference to the accompanying drawing which is a diagram of the equipment for implementing it.

MORE DETAILED DESCRIPTION

According to the invention, laser rods whose faces are to be treated are placed in an enclosure 1.

The faces have previously been opened in the 0.98 μm GaAs/GaAlAs laser rod, e.g. by cleavage under a controlled atmosphere (non-oxidizing, e.g. nitrogen), or by a collective chemical or mechanical technique. In general, a rod is treated that comprises, for example, 15 to 25 lasers each having respective first and second faces. The first faces are treated simultaneously, and then it is the turn of the second faces.

The rod to be treated, given reference 2 in the FIGURE, is placed on a support 3. The faces 2A and 2B of the lasers are treated successively, and for that purpose the support 3 is provided with means (not shown) enabling it to be pivoted through the desired angles while the method is being performed. These means are merely symbolized in the FIGURE by a curved arrow.

The enclosure is provided with means for establishing a vacuum therein and for maintaining a residual vacuum of about $10^{-7}$ to $10^{-8}$ mbar, for example.

The enclosure includes at least one other fixed support 4 serving to hold a target that is to be used in performing a laser deposition operation.

At least a portion of the enclosure is made of a material that is transparent to radiation from an external laser, which portion is referenced 1A in the FIGURE.

A laser 5 used in the treatment method of the invention is located outside the enclosure; the laser is fitted with means for adjusting its fluence, its firing rate, and its orientation so that its beam strikes either the laser faces to be treated or else the target to ablate material for deposition.

The method of the invention is as follows: the laser to be treated is placed on its support and its faces are irradiated by the pulsed laser radiation so as to clean off the oxide layers on said faces and eliminate any contamination that may have been adsorbed.

By way of example, the pulsed laser may be of the excimer type operating at a wavelength of 356 nanometers (nm), 308 nm, 248 nm, or 193 nm.

The duration of the pulses is then about 30 ns.

In a variant, the pulsed laser is of the neodymium-doped quadrupled YAG type and it enables a wavelength of 266 nm to be obtained; in which case pulse duration lies in the range 4 nanoseconds (ns) to 6 ns.

In either case, according to the invention, the fluence range of the laser lies in the range 70 mJ/cm$^2$ to 120 mJ/cm$^2$.

The number of shots, which depends on the laser used and on the selected fluence, lies in the range 1,000 to 20,000 at a rate lying in the range 10 Hz to 100 Hz.

It will be observed that a plurality of laser rods can be treated simultaneously, depending on the width of the laser beam.

The second stage of the method consists in depositing a passivation material on the cleaned faces. The passivation material is preferably silicon, but it is also possible to use gallium nitride GaN.

Advantageously, this passivation deposition is performed in the same enclosure as that which has been used for cleaning. This means that no handling is required and contributes to reducing the cost of treatment.

According to the invention, the passivation layer is deposited by the pulsed laser deposition method (PLD).

According to a characteristic of the method of the invention, the same laser 5 is used as was used for cleaning; the laser to be treated 2 is approximately oriented facing the target 4.

For silicon passivation, a pellet 6 of silicon is placed on the target. The treatment laser 5 is steered to aim at the target and its fluence and firing rate are adjusted.

This time the fluence conditions are 1 J/Cm$^2$ to 5 J/Cm$^2$. Only a few shots are required to obtain a deposit having a thickness lying in the range 2 Å to 20 Å.

It will be observed that when the deposited material is silicon, because the treatment is so short, only very few atoms of oxygen reach the faces to be treated even though the oxygen partial pressure in the enclosure is relatively high (in the range $10^{-8}$ mbar to $10^{-10}$ mbar).

When the deposited material is gallium nitride, deposition is preferably performed by placing liquid gallium on the target and by subjecting the enclosure to a nitrogen pressure such that the partial pressure of nitrogen lies in the range $10^{-3}$ mbar to $10^{-1}$ mbar; an ECR plasma is preferably created in the deposition zone to generate atomic nitrogen which is easier to incorporate in the passivation film.

The treatment is terminated by an operation consisting in depositing a layer on the faces that have received the above-described passivation treatment, which layer comprises a thickness of a few tens of angstroms of a material that is transparent at the wavelength of 0.98 μm and that is oxygen-proof, such as diamond-like carbon (DLC), silicon carbide SiC, or silicon nitride Si$_3$N$_4$.

This operation is essential when the passivation layer is silicon; it is optional when the passivation deposit is gallium nitride GaN.

This operation is performed by pulsed laser deposition. To deposit DLC, a pyrolytic carbon target is placed on the support 4; to deposit silicon carbide, a silicon carbide target is placed on the support 4; and to deposit silicon nitride, a silicon target is placed on the support 4, an atmosphere of nitrogen at low pressure is provided in the enclosure 1, and an ECR plasma is created to facilitate incorporation of the nitrogen because of the presence of atomic nitrogen.

The laser 5 is adjusted appropriately and its fluence is set to lie in the range 1 J/cm$^2$ to 5 J/cm$^2$. A few minutes suffice to obtain the desired thickness which is a few tens of angstroms.

Here again, the treatment is preferably performed in the same enclosure as before.

It has been observed that using a laser to clean the faces can cause the surface state of a facet to be degraded, in particular because arsenic-based compounds are emitted during laser irradiation. In accordance with the invention, provision is made prior to the passivation step for performing a surface reconstruction stage by cleaning the GaAs/GaAlAs faces by means of chlorine or bromine with the assistance of a UV laser. The role of irradiation by the UV laser is to cause chemical desorption of the products of chloriding (e.g. GaCl$_3$, AlCl$_x$) that form between laser pulses. For example, the faces are irradiated with a pulsed UV laser while under a chlorine pressure lying in the range $10^{-5}$ mbar to $10^{-1}$ mbar. The fluence of the laser lies in the range 5×10$^5$ W/cm$^2$ and 5×10$^6$ W/cm$^2$. This method makes the surface mirror smooth, with stoichiometric composition. The surface is then ready for the passivation stage.

The facets of the GaAs/GaAlAs lasers are constituted by at least 99% of AlGaAs. That is why the above-mentioned stage seeks to clean off the AlGaAs whose rate of removal is greater than that of GaAs.

By way of example: the laser is a KrF excimer laser (248 nm); the chlorine pressure is $10^{-5}$ mbar; and the sample is irradiated under laser fluence of about 80 mJ/cm$^2$ ($3 \times 10^6$ W/cm$^2$) at a frequency of 10 Hz. Under such conditions, this stage lasts for about 1 minute.

By means of the method of the invention, the operating lifetime of pump lasers has been increased significantly. The method is easily industrialized to provide pump lasers at greatly reduced cost.

The invention is not limited to the example described in detail, but applies to all lasers based on III–IV compounds. The person skilled in the art will be able to use the teaching of the present text to adjust the characteristic parameters.

We claim:

1. A method of preparing faces of a laser, the method comprising the following operations:

1) forming faces of a laser;

2) placing said faces in an enclosure at a pressure of about $10^{-7}$ mbar to about $10^{-8}$ mbar, and cleaning said faces by irradiation with a pulsed laser; and 3) using said pulsed laser to ablate a target so as to subject said faces to a passivation operation whereby silicon Si or gallium nitride GaN is deposited thereon by the pulsed laser deposition method until a thickness is obtained in the range of 2 Å to 20 Å.

2. A method according to claim 1, wherein operation 2) is performed in the same enclosure as operation 1).

3. A method according to claim 1, wherein, when the deposit is of gallium arsenide, said deposition is performed by pulsed laser ablation of a liquid gallium target in a nitrogen atmosphere with an ECR plasma being created.

4. A method according to claim 1, wherein said faces are subjected to additional deposition of a film that is transparent at the wavelength of the laser to be treated and that is proof against oxygen, such as DLC carbon, silicon carbide SiC, or silicon nitride $Si_3N_4$, made using the same pulsed laser operating at a fluence of 1 J/cm$^2$ to 5 J/cm$^2$ until a thickness of several tens of Å have been obtained.

5. A method according to claim 4, wherein said additional deposition is performed in the same enclosure as the cleaning operation.

6. A method according to claim 1, wherein the pulsed laser is an excimer laser operating with pulses of duration lying in the range 10 ns to 30 ns at a rate lying in the range 10 Hz to 100 Hz.

7. A method according to claim 1, wherein the pulsed laser is a neodymium-doped YAG laser operating with pulses of duration lying in the range 4 ns to 6 ns at a rate lying in the range 10 Hz to 100 Hz.

8. A method of preparing laser faces according to claim 1, wherein, when the treated laser is a GaAs/GaAsAl laser for pumping at 0.98 μm, the laser fluence during the cleaning operation lies in the range 70 mJ/cm$^2$ to 120 mJ/cm$^2$.

9. A method according to claim 8, wherein the laser fluence during the passivation operation lies in the range 1 J/cm$^2$ to 5 J/cm$^2$.

10. A method according to claim 1, wherein, prior to the passivation stage, an additional cleaning stage is performed under an atmosphere of chlorine or of bromine, using a pulsed excimer laser.

11. A method according to claim 10, wherein the atmosphere is an atmosphere of chlorine under a pressure of about $10^{-5}$ mbar.

12. A method according to claim 10, wherein the fluence of the laser is about 80 mJ/cm$^2$.

* * * * *